United States Patent
Young et al.

(10) Patent No.: US 11,644,756 B2
(45) Date of Patent: May 9, 2023

(54) 3D STRUCTURE INSPECTION OR METROLOGY USING DEEP LEARNING

(71) Applicant: KLA Corporation, Milpitas, CA (US)

(72) Inventors: Scott A. Young, Soquel, CA (US); Kris Bhaskar, San Jose, CA (US); Lena Nicolaides, Milpitas, CA (US)

(73) Assignee: KLA Corp., Milpitas, CA (US)

( * ) Notice: Subject to any disclaimer, the term of this patent is extended or adjusted under 35 U.S.C. 154(b) by 22 days.

(21) Appl. No.: 17/393,979

(22) Filed: Aug. 4, 2021

(65) Prior Publication Data

US 2022/0043357 A1  Feb. 10, 2022

Related U.S. Application Data

(60) Provisional application No. 63/062,446, filed on Aug. 7, 2020.

(51) Int. Cl.
| | | |
|---|---|---|
| *G03F 7/20* | (2006.01) | |
| *G06T 7/00* | (2017.01) | |
| *G06N 3/04* | (2023.01) | |

(52) U.S. Cl.
CPC ........ *G03F 7/7065* (2013.01); *G03F 7/70508* (2013.01); *G03F 7/70666* (2013.01);
(Continued)

(58) Field of Classification Search
CPC .... G03F 7/705; G03F 7/70508; G03F 7/7065; G03F 7/70666; G06N 3/04;
(Continued)

(56) References Cited

U.S. PATENT DOCUMENTS

| | | |
|---|---|---|
| 7,126,699 B1 | 10/2006 | Wihl et al. |
| 7,676,077 B2 | 3/2010 | Kulkarni et al. |
| | (Continued) | |

FOREIGN PATENT DOCUMENTS

| | | | | |
|---|---|---|---|---|
| CN | 106846463 A | * | 6/2017 | ............ G06T 17/00 |
| KR | 10-2020-0006028 | | 1/2020 | |
| WO | 2020/002705 | | 1/2020 | |

OTHER PUBLICATIONS

International Search Report for PCT/US2021/044859 dated Nov. 9, 2021.
(Continued)

*Primary Examiner* — Peter B Kim
(74) *Attorney, Agent, or Firm* — Ann Marie Mewherter

(57) ABSTRACT

Methods and systems for determining information for a specimen are provided. Certain embodiments relate to bump height 3D inspection and metrology using deep learning artificial intelligence. For example, one embodiment includes a deep learning (DL) model configured for predicting height of one or more 3D structures formed on a specimen based on one or more images of the specimen generated by an imaging subsystem. One or more computer systems are configured for determining information for the specimen based on the predicted height. Determining the information may include, for example, determining if any of the 3D structures are defective based on the predicted height. In another example, the information determined for the specimen may include an average height metric for the one or more 3D structures.

26 Claims, 4 Drawing Sheets

(52) U.S. Cl.
CPC .............. *G06N 3/04* (2013.01); *G06T 7/0004* (2013.01); *G06T 2207/20081* (2013.01); *G06T 2207/20084* (2013.01); *G06T 2207/30148* (2013.01)

(58) Field of Classification Search
CPC ............... G06N 3/0454; G06N 3/08; G06T 2207/10056; G06T 2207/10148; G06T 2207/10152; G06T 2207/20081; G06T 2207/20084; G06T 2207/30141; G06T 2207/30148; G06T 7/0004; G06T 7/529; G06T 7/586
See application file for complete search history.

(56) References Cited

U.S. PATENT DOCUMENTS

| | | |
|---|---|---|
| 7,782,452 B2 | 8/2010 | Mehanian et al. |
| 8,041,103 B2 | 10/2011 | Kulkarni et al. |
| 8,126,255 B2 | 2/2012 | Bhaskar et al. |
| 8,237,213 B2 | 8/2012 | Liu |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 9,222,895 B2 | 12/2015 | Duffy et al. |
| 9,830,421 B2 | 11/2017 | Bhattacharyya et al. |
| 10,127,653 B2 | 11/2018 | Duffy et al. |
| 10,733,744 B2 | 8/2020 | Ha et al. |
| 2009/0059215 A1 | 3/2009 | Mehanian et al. |
| 2013/0044302 A1* | 2/2013 | Mulder ............... G03F 7/70091 355/77 |
| 2017/0191946 A1 | 7/2017 | Smith et al. |
| 2019/0130188 A1 | 5/2019 | Zhou et al. |
| 2021/0097704 A1 | 4/2021 | Brauer et al. |
| 2021/0241478 A1* | 8/2021 | Putman ................ G02B 21/367 |
| 2022/0035256 A1* | 2/2022 | Zhang .................. G03F 7/7085 |

OTHER PUBLICATIONS

He et al., "Deep Residual Learning for Image Recognition," arXiv:1512.03385v1, Dec. 10, 2015, 12 pages.
Krizhevsky et al., "ImageNet Classification with Deep Convolutional Neural Networks," NIPS, Jan. 2012, 9 pages.
Redmon et al., "YOLO9000: Better, Faster, Stronger," arXiv:1613.08242, Dec. 25, 2016, 9 pages.
Simonyan et al., "Very Deep Convolutional Networks for Large-Scale Image Recognition," presented at International Conference on Learning Representations (ICLR) 2015, Apr. 10, 2015, 14 pages.
Szegedy et al., "Going Deeper with Convolutions," 2015 IEEE Conference on Computer Vision and Pattern Recognition (CVPR), Jun. 2015, 9 pages.
U.S. Appl. No. 17/308,878 by Brauer et al. filed May 5, 2021.
U.S. Appl. No. 17/334,179 by Brauer et al. filed May 28, 2021.
Zhou et al., "Surface Height Map Estimation from a Single Image Using Convolutional Neural Networks," Eighth International Conference on Graphic and Image Processing (ICGIP 2016), Proc. of SPIE, Feb. 8, 2017, vol. 10225, pp. 1022524 (1)-(5), pp. 2-4.

* cited by examiner

3D STRUCTURE INSPECTION OR METROLOGY USING DEEP LEARNING

BACKGROUND OF THE INVENTION

1. Field of the Invention

The present invention generally relates to methods and systems configured for determining information for a specimen. Certain embodiments relate to methods and systems for bump height three-dimensional (3D) inspection and/or metrology using deep learning (DL) artificial intelligence (AI).

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

Defect review typically involves re-detecting defects detected as such by an inspection process and generating additional information about the defects at a higher resolution using either a high magnification optical system or a scanning electron microscope (SEM). Defect review is therefore performed at discrete locations on the wafer where defects have been detected by inspection. The higher resolution data for the defects generated by defect review is more suitable for determining attributes of the defects such as profile, roughness, more accurate size information, etc.

Metrology processes are also used at various steps during a semiconductor manufacturing process to monitor and control the process. Metrology processes are different than inspection processes in that, unlike inspection processes in which defects are detected on a wafer, metrology processes are used to measure one or more characteristics of the wafer that cannot be determined using currently used inspection tools. For example, metrology processes are used to measure one or more characteristics of a wafer such as a dimension (e.g., line width, thickness, etc.) of features formed on the wafer during a process such that the performance of the process can be determined from the one or more characteristics. In addition, if the one or more characteristics of the wafer are unacceptable (e.g., out of a predetermined range for the characteristic(s)), the measurements of the one or more characteristics of the wafer may be used to alter one or more parameters of the process such that additional wafers manufactured by the process have acceptable characteristic(s).

Metrology processes are also different than defect review processes in that, unlike defect review processes in which defects that are detected by inspection are re-visited in defect review, metrology processes may be performed at locations at which no defect has been detected. In other words, unlike defect review, the locations at which a metrology process is performed on a wafer may be independent of the results of an inspection process performed on the wafer. In particular, the locations at which a metrology process is performed may be selected independently of inspection results. In addition, since locations on the wafer at which metrology is performed may be selected independently of inspection results, unlike defect review in which the locations on the wafer at which defect review is to be performed cannot be determined until the inspection results for the wafer are generated and available for use, the locations at which the metrology process is performed may be determined before an inspection process has been performed on the wafer.

Due to the large scale of circuit integration and the decreasing size of semiconductor devices, the reticles and fabricated devices have become increasingly sensitive to feature variations, such as critical dimension (CD), height, film thickness and composition, etc. In a specific example, three dimensional (3D) inspection and metrology are often used in the semiconductor industry, such as for evaluating TSV (through silicon via) and bump structures, or particle shape (size and height). Height variations, if uncorrected, can cause the final device to fail to meet the desired performance due to electrical timing errors. Even worse, they can cause the final device to malfunction and adversely affect yield.

Measuring the height of 3D structures and determining if such structures are defective based on the height can present different problems than other structure measurements and defect detection. For example, many systems and methods that are designed for inspection and measurement of wafers and other semiconductor art related specimens can be used for measuring height and detecting height related defects by imaging the specimen at different focus offsets and then determining the height of the structures based on which focus offset produces images of the structures that appear to be in best focus. In particular, when a structure appears to be in focus in one image out of several generated at different focus settings, that generally means that the surface of the structure that is being imaged is coincident with the position of the focal plane corresponding to the focus setting used to generate that one image. The height of that surface can then be determined based on that focus setting.

There can therefore be several obvious disadvantages to systems and methods used for measuring the heights of 3D structures and/or detecting defects based on height. In particular, in some such systems and methods, images of the specimen at different focus offsets may be generated simultaneously, and while that is certainly possible, the hardware of such systems tends to be relatively complicated and unlike most inspection and metrology tools in use today. Therefore, measuring height or determining height related defects may require relatively expensive tools and tools that are specific to such measurements and inspection (i.e., unlike tools that are more commonly available for inspection and metrology). One way to avoid such complicated and expensive tool hardware is to perform multiple scans of the specimen, each at a different focus setting. Such methods will have their own disadvantages, however, including the obvious increased cost and time involved in performing multiple scans instead of just one.

Regardless of whether the images are generated at different focus offsets in just one scan or multiple scans, such systems and methods also disadvantageously rely on the probability that one of the focal plane positions corresponding to one of the focus offsets used for the imaging will be coincident with the height of the structure that is being measured or inspected. Obviously, most such systems and methods will use a finite number of focus offsets for practicality purposes, and therefore whether or not a focal plane happens to correspond to the height that is being measured or inspected can impact how accurate the measurements are and how sensitive the inspections are. Judicious selection of the focus offsets used for such methods may help maximize their accuracy and/or sensitivity but cannot completely eliminate the possibility of measurement and inspection errors due to the focus offset selections.

Accordingly, it would be advantageous to develop systems and methods for determining information for 3D structures formed on a specimen that do not have one or more of the disadvantages described above.

SUMMARY OF THE INVENTION

The following description of various embodiments is not to be construed in any way as limiting the subject matter of the appended claims.

One embodiment relates to a system configured to determine information for a specimen. The system includes an imaging subsystem configured to generate images of a specimen. One or more three-dimensional (3D) structures are formed on the specimen. The system also includes one or more computer systems and one or more components executed by the one or more computer systems. The one or more components include a deep learning (DL) model configured for predicting a height of the one or more 3D structures based on one or more of the images. The one or more computer systems are configured for determining information for the specimen based on the predicted height of the one or more 3D structures. The system may be further configured as described herein.

Another embodiment relates to a computer-implemented method for determining information a specimen. The method includes generating images of a specimen with an imaging subsystem. One or more 3D structures are formed on the specimen. The method also includes predicting a height of the one or more 3D structures based on one or more of the images by inputting the one or more of the images into a DL model included in one or more components executed by one or more computer systems. In addition, the method includes determining information for the specimen based on the predicted height of the one or more 3D structures. The determining is performed by the one or more computer systems.

Each of the steps of the method described above may be further performed as described herein. In addition, the embodiment of the method described above may include any other step(s) of any other method(s) described herein. Furthermore, the method described above may be performed by any of the systems described herein.

Another embodiment relates to a non-transitory computer-readable medium storing program instructions executable on one or more computer systems for performing a computer-implemented method for determining information for a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
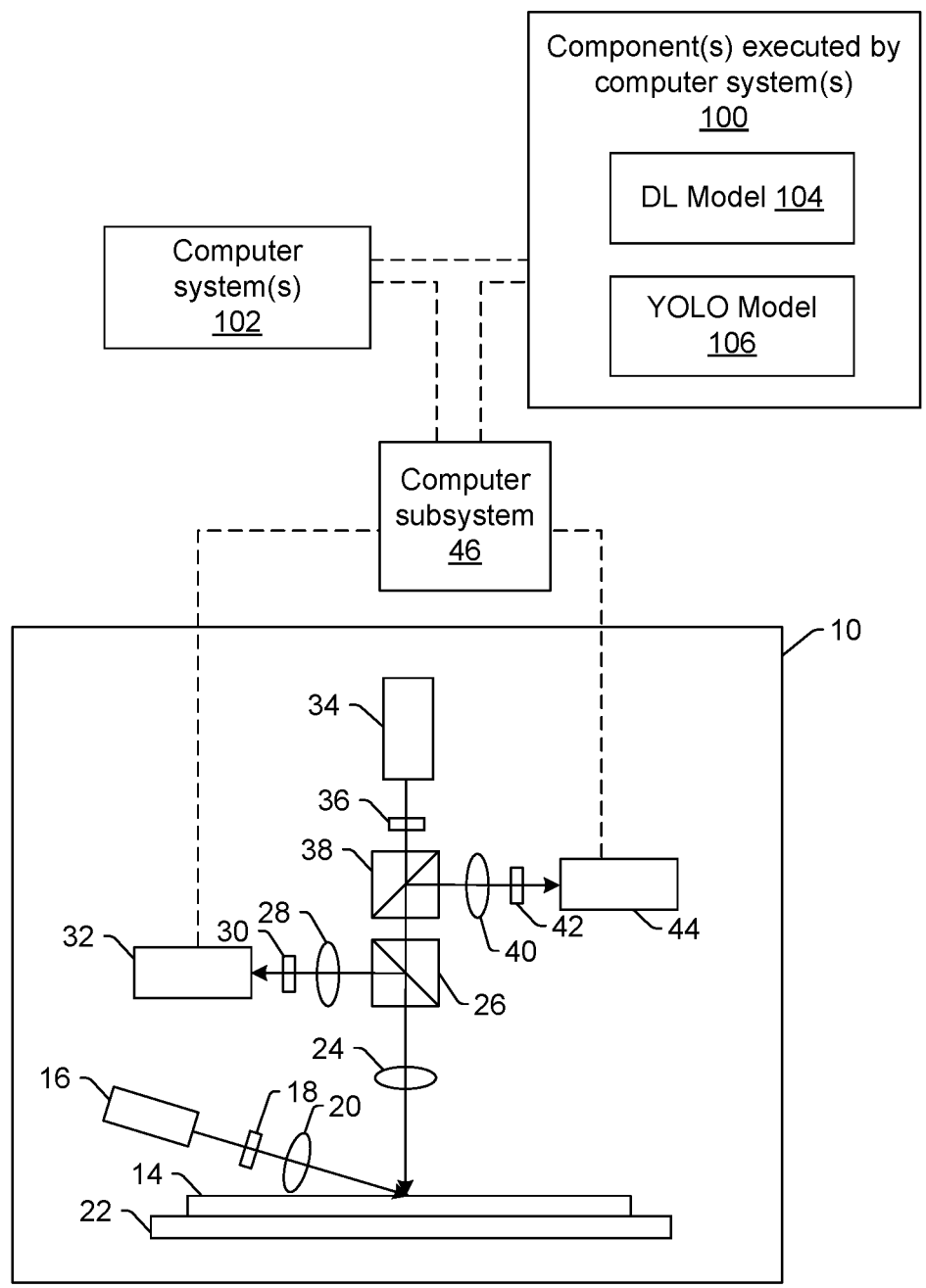
FIGS. 1 and 1a are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

In general, the embodiments described herein relate to methods and systems for determining information for a specimen. Some embodiments described herein are configured for bump height three-dimensional (3D) inspection and metrology using deep learning (DL) artificial intelligence (AI).

One embodiment of a system configured to determine information for a specimen is shown in FIG. 1. The system includes one or more computer systems (e.g., computer subsystem 46 and computer system(s) 102) and one or more components 100 executed by the one or more computer systems. The system also includes imaging subsystem 10 configured to generate images of a specimen. In one embodiment, the imaging subsystem is configured as a light based subsystem. For example, in the embodiment of FIG. 1, the imaging subsystem is configured for scanning light over or directing light to a physical version of the specimen while detecting light from the specimen to thereby generate the images for the specimen. The imaging subsystem may also be configured to perform the scanning (or directing) and the detecting with multiple modes as described further herein.

In the embodiment of the system shown in FIG. 1, imaging subsystem 10 includes an illumination subsystem configured to direct light to specimen 14. The illumination subsystem includes at least one light source. As shown in FIG. 1, the illumination subsystem includes light source 16 and/or light source 34. The illumination subsystem may be configured to direct the light to the specimen at one or more angles of incidence, which may include one or more oblique angles and/or one or more normal angles. For example, as shown in FIG. 1, light from light source 16 is directed through optical element 18 and then lens 20 to specimen 14 at an oblique angle of incidence. The oblique angle of incidence may include any suitable oblique angle of incidence, which may vary depending on, for instance, characteristics of the specimen. The light from light source 34 may be directed through optical element 36, beamsplitters 38 and 26, and then lens 24 to specimen 14 at a normal (or substantially normal) angle of incidence. If the angle at which light from light source 34 is directed to the specimen is not exactly normal, the substantially normal angle of incidence may be selected as described above, e.g., based on characteristics of the specimen.

The imaging subsystem may be configured to direct the light to the specimen at different angles of incidence at different times. For example, the imaging subsystem may be configured to direct light from one of the light sources to the specimen and then to direct light from the other of the light sources to the specimen. The imaging subsystem may also or alternatively be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels may include light source 34, optical element 36, and lens 24. If light from multiple illumination channels is directed to the specimen at the same time, one or more characteristics (e.g., wavelength, polarization, etc.) of the light directed to the specimen at different angles of incidence may be different such that light resulting from illumination of the specimen at the different angles of incidence can be separated from each other and separately detected at the detector(s).

The same illumination channel may also be configured to direct light to the specimen with different characteristics at different times. For example, in some instances, optical elements 18 and 36 may be configured as spectral filters and the properties of the spectral filters can be changed in a variety of different ways (e.g., by swapping out the spectral filters) such that different wavelengths of light can be directed to the specimen at different times. The illumination subsystem may have any other suitable configuration known in the art for directing the light having different or the same characteristics to the specimen at different or the same angles of incidence sequentially or simultaneously.

In one embodiment, light sources 16 and 34 may each include a broadband plasma (BBP) light source. In this manner, the light generated by the light sources and directed to the specimen may include broadband light. However, the light sources may include any other suitable light sources such any suitable lasers, arc lamps, multiple color light emitting diodes (LEDs), etc. known in the art configured to generate light at any suitable wavelength(s) known in the art. The lasers or other light sources may be configured to generate light that is monochromatic or nearly-monochromatic. In this manner, the lasers or other light sources may be narrowband lasers or light sources. The light sources may also include polychromatic light sources that generate light at multiple discrete wavelengths or wavebands. Light sources 16 and 34 may also be the same type of light sources, possibly with one or more different light emitting characteristics (e.g., lasers that emit different wavelengths), or different types of light sources (e.g., one light source may be a BBP light source and the other light source may be a laser).

Light from optical element 18 may be focused onto specimen 14 by lens 20, and light from optical element 36 may be focused onto specimen 14 by lens 24. Although lenses 20 and 24 are shown in FIG. 1 as single refractive optical elements, in practice, lenses 20 and 24 may each include a number of refractive and/or reflective optical elements that in combination focus the light from their respective optical elements to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the imaging subsystem may be configured to alter one or more of the elements of the illumination subsystem based on the type of illumination to be used for imaging.

The imaging subsystem may also include a scanning subsystem configured to cause the light to be scanned over the specimen. For example, the imaging subsystem may include stage 22 on which specimen 14 is disposed during imaging. The scanning subsystem may include any suitable mechanical and/or robotic assembly (that includes stage 22) that can be configured to move the specimen such that the light can be scanned over the specimen. In addition, or alternatively, the imaging subsystem may be configured such that one or more optical elements of the imaging subsystem perform some scanning of the light over the specimen. The light may be scanned over the specimen in any suitable fashion such as in a serpentine-like path or in a spiral path.

The imaging subsystem further includes one or more detection channels. In general, each of the detection channels includes a detector configured to detect light from the specimen due to illumination of the specimen by its corresponding illumination subsystem and to generate output responsive to the detected light. For example, the imaging subsystem shown in FIG. 1 includes two detection channels, one formed by lens 24, beamsplitter 26, lens 28, element 30, and detector 32 and another formed by lens 24, beamsplitter 38, lens 40, element 42, and detector 44. The two detection channels may be configured to collect and detect light at different or the same angles of collection. In some instances, the detection channel that includes detector 32 is configured to detect light scattered from the specimen due to illumination with light from light source 16, and the detection channel that includes detector 44 is configured to detect light specularly reflected from the specimen due to illumination with light from light source 34. Therefore, the detection channel that includes detector 32 may be configured as a dark field (DF) channel, and the detection channel that includes detector 44 may be configured as a bright field (BF) channel.

Although FIG. 1 shows an embodiment of the imaging subsystem that includes two detection channels, the imaging subsystem may include a different number of detection channels (e.g., only one detection channel or two or more detection channels). In one such instance, the imaging subsystem may include one or more DF channels and/or one or more BF channels. Therefore, the imaging subsystems described herein may be configured for only DF, only BF, or both DF and BF imaging (simultaneous or sequential).

Although lenses 28 and 40 are shown in FIG. 1 as single refractive optical elements, each of the lenses may include one or more refractive optical element(s) and/or one or more reflective optical element(s). Beam splitters 26 and 38 may have any suitable configuration known in the art. As shown in FIG. 1, lens 24 may be configured to direct light from light source 34 to the specimen and to collect light scattered from the specimen due to illumination with light from light source 16 and light specularly reflected from the specimen due to illumination with light from light source 34. Therefore, the detection channels may share a common lens. However, the detection channels may not share any common elements or may share more than one common element (not shown; e.g., like a common spectral filter). Elements 30 and 42 may each include any one or more suitable elements known in the art such as apertures, spatial filters, analyzers, other polarizing elements or filters, spectral filters, and the like. In addition, although only one element is shown positioned in the path of the light to each of the detectors, more than one such element may be used in each detection channel (such as a combination of a spectral filter and a spatial filter).

The one or more detection channels may include any suitable detectors known in the art such as photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the imaging subsystem may be signals or data, but not image signals or image data. In such instances, a computer subsystem such as computer subsystem 46 may be configured to generate images of the specimen from the non-imaging output of the detectors. However, in other instances, the detectors may be configured as imaging detectors that are configured to generate image signals or image data. Therefore, the imaging subsystem may be configured to generate images in a number of ways.

It is noted that FIG. 1 is provided herein to generally illustrate a configuration of an imaging subsystem that may be included in the system embodiments described herein. Obviously, the imaging subsystem configuration described herein may be altered to optimize the performance of the imaging subsystem as is normally performed when designing a commercial imaging system. In addition, the systems described herein may be implemented using an existing system (e.g., by adding functionality described herein to an existing system) such as the Altair series of tools that are commercially available from KLA Corp., Milpitas, Calif. For some such systems, the embodiments described herein may be provided as optional functionality of the system (e.g., in addition to other functionality of the system). Alternatively, the imaging subsystem described herein may be designed "from scratch" to provide a completely new imaging subsystem. The imaging subsystem may be further configured as described in U.S. Pat. No. 7,782,452 issued Aug. 24, 2010 to Mehanian et al. and U.S. Patent Application Publication No. 2009/0059215 published Mar. 5, 2009 by Mehanian et al., which are incorporated by reference as if fully set forth herein. The embodiments described herein may be further configured as described in these references.

Computer subsystem 46 may be coupled to the detectors of the imaging subsystem in any suitable manner (e.g., via one or more transmission media, which may include "wired" and/or "wireless" transmission media) such that the computer subsystem can receive the output generated by the detectors during scanning of the specimen. Computer subsystem 46 may be configured to perform a number of functions described further herein using the output of the detectors.

The computer subsystem shown in FIG. 1 (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems. For example, computer subsystem 46 may be coupled to computer system(s) 102 as shown by the dashed line in FIG. 1 by any suitable transmission media, which may include any suitable wired and/or wireless transmission media known in the art. Two or more of such computer subsystems may also be effectively coupled by a shared computer-readable storage medium (not shown).

Figure 1A:
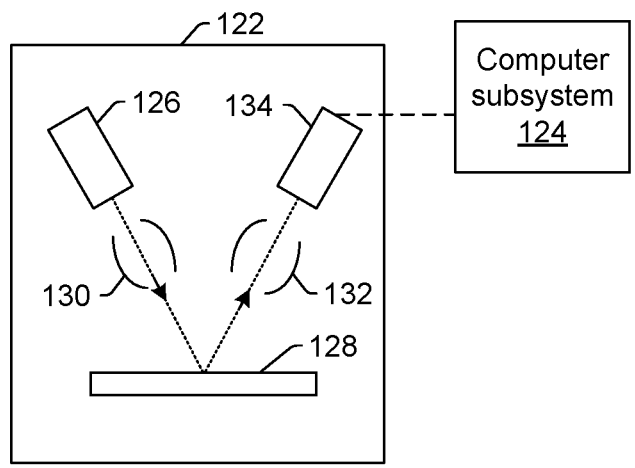

Although the imaging subsystem is described above as being an optical or light-based imaging subsystem, in some embodiments, the imaging subsystem is configured as an electron beam subsystem. In one such embodiment shown in FIG. 1a, the imaging subsystem includes electron column 122 coupled to computer subsystem 124. As also shown in FIG. 1a, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1a as being configured such that the electrons are directed to the specimen at an oblique angle of incidence and are scattered from the specimen at another oblique angle, the electron beam may be directed to and scattered from the specimen at any suitable angles. In addition, the electron beam subsystem may be configured to use multiple modes to generate images of the specimen as described further herein (e.g., with different illumination angles, collection angles, etc.). The multiple modes of the electron beam subsystem may be different in any image generation parameters of the imaging subsystem.

Computer subsystem 124 may be coupled to detector 134 as described above. The detector may detect electrons returned from the surface of the specimen thereby forming electron beam images of the specimen. The electron beam images may include any suitable electron beam images. Computer subsystem 124 may be configured to perform one or more functions described further herein for the specimen using output generated by detector 134. Computer subsystem 124 may be configured to perform any additional step(s) described herein. A system that includes the imaging subsystem shown in FIG. 1a may be further configured as described herein.

It is noted that FIG. 1a is provided herein to generally illustrate a configuration of an electron beam subsystem that may be included in the embodiments described herein. As with the optical subsystem described above, the electron beam subsystem configuration described herein may be altered to optimize the performance of the imaging subsystem as is normally performed when designing a commercial imaging system. In addition, the systems described herein may be implemented using an existing system (e.g., by adding functionality described herein to an existing system). For some such systems, the embodiments described herein may be provided as optional functionality of the system (e.g., in addition to other functionality of the system). Alternatively, the system described herein may be designed "from scratch" to provide a completely new system.

Although the imaging subsystem is described above as being an optical or electron beam subsystem, the imaging subsystem may be an ion beam subsystem. Such an imaging subsystem may be configured as shown in FIG. 1a except that the electron beam source may be replaced with any suitable ion beam source known in the art. In addition, the imaging subsystem may be any other suitable ion beam subsystem such as those included in commercially available focused ion beam (FIB) systems, helium ion microscopy (HIM) systems, and secondary ion mass spectroscopy (SIMS) systems.

The imaging subsystems described herein may be configured to generate output, e.g., images, of the specimen with multiple modes. In general, a "mode" is defined by the values of parameters of the imaging subsystem used for generating images of a specimen (or the output used to generate images of the specimen). Therefore, modes may be different in the values for at least one of the parameters of the imaging subsystem (other than position on the specimen at which the output is generated). For example, in an optical subsystem, different modes may use different wavelength(s) of light for illumination. The modes may be different in the illumination wavelength(s) as described further herein (e.g., by using different light sources, different spectral filters, etc. for different modes). In another example, different modes may use different illumination channels of the optical subsystem. For example, as noted above, the optical subsystem may include more than one illumination channel. As such, different illumination channels may be used for different modes. The modes may also or alternatively be different in one or more collection/detection parameters of the optical subsystem. The modes may be different in any one or more alterable parameters (e.g., illumination polarization(s), angle(s), wavelength(s), etc., detection polarization(s), angle(s), wavelength(s), etc.) of the imaging subsystem. The imaging subsystem may be configured to scan the specimen with the different modes in the same scan or different scans, e.g., depending on the capability of using multiple modes to scan the specimen at the same time.

In a similar manner, the output generated by the electron beam subsystem may include output, e.g., images, generated by the electron beam subsystem with two or more different values of a parameter of the electron beam subsystem. The multiple modes of the electron beam subsystem can be defined by the values of parameters of the electron beam subsystem used for generating output and/or images for a specimen. Therefore, modes may be different in the values for at least one of the electron beam parameters of the electron beam subsystem. For example, different modes may use different angles of incidence for illumination.

The subsystems described herein and shown in FIGS. 1 and 1a may be modified in one or more parameters to provide different imaging capability depending on the application for which they will be used. In one embodiment, the imaging subsystem is configured as an inspection subsystem. In another embodiment, the imaging subsystem is configured as a metrology subsystem. For example, the imaging subsystem shown in FIG. 1 may be configured to have a higher resolution if it is to be used for metrology rather than for inspection. In other words, the embodiments of the imaging subsystems shown in FIGS. 1 and 1a describe some general and various configurations for an imaging subsystem that can be tailored in a number of manners that will be obvious to one skilled in the art to produce imaging subsystems having different imaging capabilities that are more or less suitable for different applications.

In some embodiments in which the imaging subsystem is configured as an inspection subsystem, the inspection subsystem is configured for macro inspection. In this manner, the systems described herein may be referred to as a macro inspection tool. A macro inspection tool is particularly suitable for inspection of relatively noisy BEOL layers such as RDL and post-dice applications. A macro inspection tool is defined herein as a system that is not necessarily diffraction limited and has a spatial resolution of about 200 nm to about 2.0 microns and above. Such spatial resolution means that the smallest defects that such systems can detect have dimensions of greater than about 200 nm, which is much larger than the smallest defects that the most advanced inspection tools on the market today can detect, hence the "macro" inspector designation. Such systems tend to utilize longer wavelengths of light (e.g., about 500 nm to about 700 nm) compared to the most advanced inspection tools on the market today. These systems may be used when the defects of interest (DOIs) have relatively large sizes and possibly also when throughputs of 100 wafers per hour (wph) or more are required (wafer throughput here refers to number of 300 mm wafers inspected per hour).

As noted above, the imaging subsystem is configured for scanning energy (e.g., light, electrons, etc.) over a physical version of the specimen thereby generating output for the physical version of the specimen. In this manner, the imaging subsystem may be configured as an "actual" subsystem, rather than a "virtual" subsystem. However, a storage medium (not shown) and computer system(s) 102 shown in FIG. 1 may be configured as a "virtual" system. In particular, the storage medium and the computer subsystem(s) may be configured as a "virtual" inspection system as described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents.

In one embodiment, the specimen is a wafer. The wafer may include any wafer known in the semiconductor arts. Although some embodiments may be described herein with respect to a wafer, the embodiments are not limited in the specimen for which they can be used. For example, the embodiments described herein may be used for specimens such as reticles, flat panels, personal computer (PC) boards, and other semiconductor specimens.

In the embodiments described herein, one or more 3D structures are formed on the specimen. In one such embodiment, the one or more 3D structures are one or more bumps formed on a wafer. Although some embodiments may be described herein with respect to "bumps," the embodiments described herein may be useful for determining information for any specimens that have structures formed thereon whose height is of interest to a user and/or whose height can render the structures defective. The one or more 3D structures may also include one or more instances of a 3D structure, with each instance having the same design (even if they may have somewhat different characteristics when formed on the specimen). For example, each of the 3D structure(s) may include bumps, all having the same design but possibly having different contextual information if they are formed in different areas of the specimen having different designs or different patterns. In this manner, all of the 3D structure(s) for which height is predicted by the embodiments described herein may be the same type of structure having the same design characteristics for the 3D structures themselves.

However, not all of the 3D structures whose height is predicted by the embodiments described herein may be the same type. For example, some specimens may have multiple types of 3D structures formed thereon having different as designed characteristics, e.g., bumps and traces, and the embodiments described herein may be used to predict the height of any or all of the 3D structures that are of interest to the user. In some such instances, different DL models that are trained separately may be used to predict height for different types of 3D structures (so that each of the DL models learns an accurate transformation between specimen images and predicted structure height for one of the 3D structure types). In addition, the computer system(s) may separately determine different information for different 3D structure types, e.g., determine which bumps are defective based on only the output of the DL model trained for bump height prediction and separately determine which traces are defective based on only the output of the DL model trained for predicting trace height. Regardless, when determining information for different types of 3D structures, each of those determining steps may be performed as described further herein, and the same specimen images may be input to the DL model for each structure type.

Figure 2:
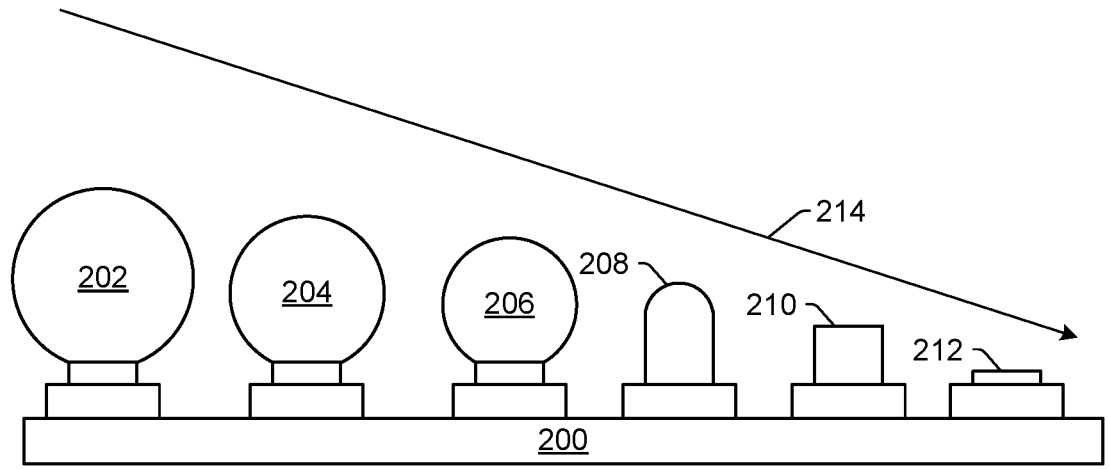
FIG. 2 is a schematic diagram illustrating a cross-sectional view of examples of bumps and how their designs change over time.

FIG. 2 shows some examples of bumps and how they are expected to change over time. In particular, FIG. 2 shows different bumps formed on hypothetical wafer 200 with arrow 214 showing progress along the industry bump roadmap. In this manner, only one type of bump technology shown in FIG. 2 would be used in a single wafer design since FIG. 2 depicts the industry technology for bumps changing over time (years). In general, as can be seen from the bumps shown in this figure, the bump size and pitch both get smaller over time. Bump 202 shown at the earliest point in the industry bump roadmap is a standard C4 type bump having a size of 100 um and a pitch of 150 um to 200 um. Bump 204 shown at the next point in time is a fine pitch C4 type bump having a size of 50 um and a pitch of 100 um. Bump 206 is a micro C4 type bump having a size of 20 um to 30 um and a pitch of 30 um to 60 um. Bump 208 is a copper (Cu) pillar type bump having a size of 15 um to 20 um and a pitch of 20 um to 40 um. Bump 210 is a flat CU type bump having a size of 10 um and a pitch of 20 um. Bump 212 is a bump-less type bump having a size of 5 um and a pitch of 10 um. The embodiments described herein can be used for predicting height and determining information for any of the bumps shown in FIG. 2.

In one embodiment, the 3D structure(s) include 3D NAND structure(s) formed on a wafer. 3D NAND (where NAND stands for not-AND, a type of logic gate in semiconductor devices) is a type of non-volatile flash memory that includes vertical stacks of multiple layers of memory cells. For example, the structure of 3D NAND generally includes silicon bit cell gates formed of alternating conductive and insulating layers formed on a wafer and separated by one or more high aspect ratio (HAR) structures such as charge traps formed of materials like silicon nitride and channel(s) formed on silicon. That vertical stacking of the memory cells gives the 3D NAND structures their 3D quality.

The 3D structure(s) described herein may also include any other HAR structure known in the art. As used herein, the term "HAR structure" refers to any structure characterized by an aspect ratio that exceeds 10:1 and may be as high as 100:1 in future generation devices. HAR structures often include hard mask layers (see, for example, U.S. Pat. No. 8,237,213 to Liu issued on Aug. 7, 2012, which is incorporated by reference as if fully set forth herein) to facilitate etch processes for HARs. In addition to vertical NAND or terabit cell array transistor (TCAT) structures, the embodiments described herein can be used for other HAR structures whose height is of interest.

In addition to the 3D structures described above, in general, the embodiments described herein can be used to predict height of any structure on a specimen regardless of its aspect ratio or other physical characteristics. For example, the embodiments described herein can be useful for predicting the height of structures such as traces, pads, and the like even if those structures are not very 3D in nature. In general, all that is required is a properly trained DL model that has learned how to transform specimen images into structure heights.

As mentioned above, the system includes one or more computer systems (e.g., computer subsystem 46 and/or computer system(s) 102 shown in FIG. 1) and one or more components (e.g., component(s) 100) executed by the one or more computer systems. The one or more components include DL model 104 configured for predicting a height of the one or more 3D structures based on one or more of the images. In some particularly useful implementations of the embodiments described herein, during an inspection run at a single inspection focus, the imaging subsystem may collect the inspection images (BF and DF), the one or more computer systems may cut out the bumps from the inspection images as described further herein, and the pretrained DL model may predict the bump height using these cut out bump images.

Figure 4:
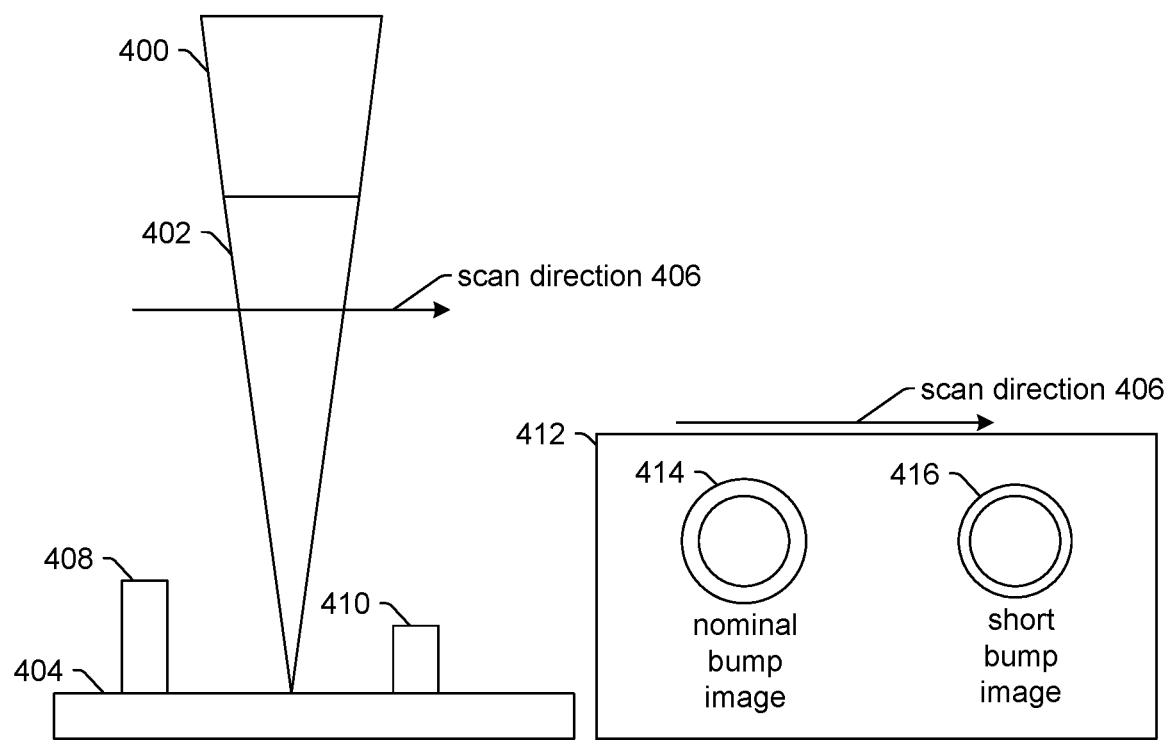
FIG. 4 is a schematic diagram illustrating a cross-sectional view of examples of bumps on a specimen being scanned by an imaging subsystem embodiment described herein and a plan view of an image generated by the imaging subsystem.

FIG. 4 shows generally why the images described herein can be used by the DL model to predict bump height. In particular, an imaging subsystem such as that described herein may include optical element 400 such as a lens described further herein that is configured to focus light 402 to specimen 404 as the light is scanned over the specimen in scan direction 406. As shown in FIG. 4, two different bumps 408 and 410 having different heights may be formed on the specimen and imaged by the imaging subsystem as the light is scanned over the specimen. Such scanning may therefore generate image 412 that includes image 414 of bump 408 and image 416 of bump 410.

As can be seen in FIG. 4, bumps having different heights will produce bump images that are different from each other. In particular, the bump top defocus varies with bump height. For example, bump 408 may be a nominal bump meaning that its height is acceptable while bump 410 may be a short bump meaning that its height is smaller than acceptable. As such, bump 408 is not defective while bump 410 is. These differences in height produce differences in the in focus appearance of the images of the bump tops. In particular, nominal bump top image 414 may be more out of focus while short bump top image 416 may be more in focus.

Therefore, by training the DL model with a training set that includes images generated for bumps having different heights and the known (or simulated) heights of those bumps, the DL model can learn how to transform an input image into a bump height. The output of the DL model is referred to herein as a "predicted" height because it is not a ground truth measurement of the height. In other words, the height of the bumps is predicted via a learned relationship between training bump images generated for bumps having known (or simulated) different heights.

Generally speaking, "deep learning" (DL) (also known as deep structured learning, hierarchical learning or deep machine learning) is a branch of machine learning (ML) based on a set of algorithms that attempt to model high level abstractions in data. In a simple case, there may be two sets of neurons: ones that receive an input signal and ones that send an output signal. When the input layer receives an input, it passes on a modified version of the input to the next layer. In a DL-based model, there are usually many layers between the input and output (and the layers are not made of neurons but it can help to think of it that way), allowing the algorithm to use multiple processing layers, composed of multiple linear and non-linear transformations.

DL is part of a broader family of ML methods based on learning representations of data. An observation (e.g., an image) can be represented in many ways such as a vector of intensity values per pixel, or in a more abstract way as a set of edges, regions of particular shape, etc. Some representations are better than others at simplifying the learning task.

One of the promises of DL is replacing handcrafted features with efficient algorithms for unsupervised or semi-supervised feature learning and hierarchical feature extraction. In particular, as described further herein, the DL model can be learned (in that its parameters can be learned) based on a suitable training set of data.

In one embodiment, the DL model is configured as a convolutional neural network (CNN). A CNN usually includes stacks of convolution and pooling layers, to extract local features. The convolutional layer(s) may have any suitable configuration known in the art and are generally configured to determine features for an image as a function of position across the image (i.e., a feature map) by applying a convolution function to the input image using one or more filters. The one or more pooling layers may also have any suitable configuration known in the art (e.g., max pooling layers) and are generally configured for reducing the dimensionality of the feature map generated by the one or more convolutional layers while retaining the most important features. The DL model may have any suitable CNN configuration or architecture known in the art.

In another embodiment, the DL model includes a combination of convolution layers and fully connected layers. The convolution layers may be configured as described above. A "fully connected layer" may be generally defined as a layer in which each of the nodes is connected to each of the nodes in the previous layer. The fully connected layer(s) perform classification based on the features extracted by the convolutional layer(s). For example, the convolution layer(s) may be configured to generate a feature map thereby determining features for image(s), which may include any of the image(s) and inputs described further herein. The fully connected layer(s) are configured for feature selection and height prediction. In other words, the fully connected layer(s) select features from a feature map and then predict heights of the one or more 3D structures. The selected features may include all of the features in the feature map (if appropriate) or only some of the features in the feature map. Such a DL network (including the convolution layers(s) and the fully connected layer(s)) outputs a height prediction, which may include a height prediction per 3D structure with a confidence associated with each height prediction.

In a further embodiment, the DL model is configured as an AlexNet. In general, an AlexNet includes a number of convolutional layers (e.g., 5) followed by a number of fully connected layers (e.g., 3) that are, in combination, configured and trained to classify images. Examples of neural networks configured as AlexNets are described in "ImageNet Classification with Deep Convolutional Neural Networks" by Krizhevsky et al., NIPS 2012, which is incorporated by reference as if fully set forth herein. The DL model described herein may be further configured as described in this reference.

In one simplified version of an AlexNet that may be used as the DL model, the input to the AlexNet may include input images, which may include any of the images described herein such as patch images having a size of about 32 pixels by 32 pixels for any of the bump candidates located and isolated in the images generated by the imaging subsystem. The images are input to convolution layer(s), which is/are followed by pooling layer(s), convolution layer(s), and pooling layer(s). These layers may be configured as described further herein. Output of the final pooling layer(s) is input to fully connected layer(s), which may include, for example, two different sets of fully connected layer(s). The fully connected layer(s) may be configured as described further herein. The last fully connected layer may generate output, which may include any of the output described herein. For example, as described further herein, the output may include a height metric for each of the bumps whose images are input to the DL model.

In another embodiment, the DL model is configured as a GoogleNet. A GoogleNet may include convolutional, pooling, and fully connected layers such as those described further herein configured and trained to classify images. While the GoogleNet architecture may include a relatively high number of layers (especially compared to some other networks described herein), some of the layers may be operating in parallel, and groups of layers that function in parallel with each other are generally referred to as inception modules. Other layers may operate sequentially. Therefore, a GoogleNet is different from other networks described herein in that not all of the layers are arranged in a sequential structure. Examples of neural networks configured as GoogleNets are described in "Going Deeper with Convolutions," by Szegedy et al., CVPR 2015, which is incorporated by reference as if fully set forth herein. The DL model described herein may be further configured as described in this reference.

In a further embodiment, the DL model is configured as a VGG network. VGG networks were created by increasing the number of convolutional layers while fixing other parameters of the architecture. Adding convolutional layers to increase depth is made possible by using substantially small convolutional filters in all of the layers. Like the other networks described herein, VGG networks were created and trained to classify images. VGG networks also include convolutional layers followed by fully connected layers. Examples of neural networks configured as VGG are described in "Very Deep Convolutional Networks for Large-Scale Image Recognition," by Simonyan et al., ICLR 2015, which is incorporated by reference as if fully set forth herein. The DL model described herein may be further configured as described in this reference.

In some embodiments, the DL model is configured as a deep residual network. Like some other networks described herein, a deep residual network may include convolutional layers followed by fully connected layers, which are, in combination, configured and trained for image classification. In a deep residual network, the layers are configured to learn residual functions with reference to the layer inputs, instead of learning unreferenced functions. In particular, instead of hoping each few stacked layers directly fit a desired underlying mapping, these layers are explicitly allowed to fit a residual mapping, which is realized by feedforward neural networks with shortcut connections. Shortcut connections are connections that skip one or more layers. A deep residual net may be created by taking a plain neural network structure that includes convolutional layers and inserting shortcut connections which thereby takes the plain neural network and turns it into its residual learning counterpart. Examples of deep residual nets are described in "Deep Residual Learning for Image Recognition" by He et al., NIPS 2015, which is incorporated by reference as if fully set forth herein. The DL model described herein may be further configured as described in this reference.

The DL models described herein may or may not be trained by the one or more computer systems and/or one of the component(s) executed by the computer system(s). For example, another method or system may train the DL model, which then may be stored for use as the component(s) executed by the computer system(s). The DL model may also be trained or built any time prior to runtime. In one such example, the DL model may be built during inspection recipe training or setup. The DL models described herein may also be updated, retrained, or revised at any time after setup and/or deployment of a trained model.

In another embodiment, the computer system(s) are configured for generating a training set that includes training images of 3D structures on the specimen or a different specimen generated with the imaging subsystem and corresponding height information for the 3D structures in the training images. The training set may be generated in various ways described further herein. The computer system(s) may then use the training set to train the DL model or the training set may be used by another method or system to train the DL model.

In any of the embodiments described herein, generating a training set may include storing the training images and corresponding height information in any suitable manner and with any suitable format such that the training set can be used for training a DL model. The computer system(s) may store information for the training set in any of the computer readable storage media described herein. The training set may be used by the computer system(s) in any suitable manner known in the art including being split into subsets for training and verification, being updated, modified, or replaced over time or when the process changes, etc.

A DL model may then be trained based on a training set that includes specimen patch images with corresponding height information. The specimen images are the training inputs, and the corresponding height information are the training outputs. The training may include inputting the training inputs into the DL model and altering one or more parameters of the DL model until the output produced by the DL model matches (or substantially matches) the training outputs. Training may include altering any one or more trainable parameters of the DL model. For example, the one or more parameters of the DL model that are trained may include one or more weights for any layer of the DL model that has trainable weights. In one such example, the weights may include weights for convolution layers but not pooling layers.

In one embodiment, the one or more computer systems are configured for training the DL model with the images generated by the imaging subsystem of the specimen or a different specimen with two or more focus offsets. If the images are of a different specimen, the different specimen is preferably the same type as the specimen (i.e., formed of the same materials with the same design and fabrication processes). In this manner, for training, the embodiments may collect wafer images at various focus offsets. In one such example, the imaging subsystem may generate images at z focus slices from −30 um to +30 um around the wafer surface, and those images may be used to train the DL model as described herein. In another such example, the imaging subsystem may generate images at z focus slices from 0 um to 80 um above the wafer surface, and those images may be used to train the DL model as described herein. In general, the more training data (e.g., more focus slices and more bumps) generated and used for training, the better the accuracy of the heights predicted by the trained DL model.

In each generated image, the computer system(s) may locate and cut out 2D bump image patches, which may be performed in any suitable manner described herein. For example, given relatively large frame images at different z focus offsets, the computer system(s) may crop patches from the frames, one patch per bump. The computer system(s) may then train the DL model with these image patches with the focus offsets as bump height ground truth data. That training may be performed as described further herein.

The computer system(s) may however train the DL model with image patches from other sources as the bump height ground truth data. For example, grabbing full images from the imaging subsystem running at various focus offsets to simulate bumps of different heights may be useful when a specimen with various known bump heights is not available for training. The computer system(s) may take those images grabbed at various focus offsets, crop them and mask out all but the bump top, and train the DL model with them as if they were bumps of various heights.

However, in another embodiment, the one or more computer systems are configured for training the DL model with images generated by the imaging subsystem of a different specimen having the 3D structures formed thereon with multiple, known values of a characteristic of the 3D structures. In other words, if a wafer having bumps formed thereon with different, programmed heights is available, the wafer may be imaged by the imaging subsystem at a single focus value. The bumps in the wafer images may be located and isolated as described herein. Based on information for the design of the wafer, the known, programmed heights of the different bumps may be assigned to their bump images. In this manner, the located and isolated bump images may be the training input, and the known bump heights may be the training output. Therefore, the known, predetermined bump heights and the bump images may serve as the ground truth for DL training. This training may also be performed as described further herein.

The ground truth training data may also come from any other source of ground truth bump height measurement. For example, if a ground truth, bump height measurement tool is available for use, that ground truth, bump height measurement tool may be used to measure the bump heights on a wafer or wafers as long as the bumps on the wafer(s) have relatively diverse bump heights. The wafer(s) may then be imaged by the imaging subsystem that will be used to generate images for bump height prediction on other wafers. Bump image location and isolation may then be performed on those images as described further herein. Based on where on the specimen a bump image was generated, its corresponding ground truth bump height can be determined from the ground truth measurement data and where on the wafer it was measured. In this manner, imaging subsystem bump images and corresponding ground truth, bump height measurement data may be correlated in pairs of training data and used as described herein for DL model training.

In one embodiment, the one or more of the images used for predicting the height are collected by the imaging subsystem in a single pass of the specimen. In another embodiment, the one or more of the images used for predicting the height are collected by the imaging subsystem at a single focus value. For example, the images that are used to determine information for the specimen such as finding defective bumps and/or determining a bump height metric may include images generated in a single wafer image collection pass. In addition, it may be possible to use the existing defect inspection pass as the source of images for the embodiments described herein. In other words, the embodiments described herein may, by appropriate training of the DL model, be able to use the current inspection recipe to generate the images that are input to the DL model.

One advantage of the embodiments described herein is, therefore, that they are much faster than existing methods such as those that require images generated at multiple focus offsets (and therefore possibly multiple passes) for substantially accurate bump height prediction. Another advantage of the embodiments described herein is that they can use existing imaging and mechanical hardware of tools such as the Altair inspection tool commercially available from KLA. For example, during an inspection run at a single inspection focus, the imaging subsystem may collect the inspection images (BF and DF), the one or more computer systems may cut out the bumps as described further herein, and the pretrained DL model may predict the bump height using these cut out bump images. Since the embodiments described herein can get all bump heights using the same objective and focus offset images as used for the tool's existing defect inspection algorithms, the embodiments described herein can save a user wafer inspection tool time. The tool can grab a normal wafer image for defect inspection and then use the same image for bump height measurement. This ability can save a substantial amount of time compared to old methods that may require separate image grabs often with a unique set of optics.

In one embodiment, the images include BF images of the specimen or DF images of the specimen. In another embodiment, the images include BF images of the specimen and DF images of the specimen. In this manner, the images that are grabbed for training and runtime may include images grabbed using both BF and DF imaging modes or only one of those modes. In general, it may be preferable to use both BF and DF images (or other multi-mode images) for the embodiments described herein, but only BF or only DF images (or other single mode images) can also be used possibly with not as good performance (e.g., maybe with somewhat lower accuracy) than when using both BF and DF images (or other multi-mode images). In a similar manner, smaller or larger optics magnifications can also be used by the embodiments described herein with less or more accuracy and speed. Multi-mode and single-mode images may be generated by the imaging subsystem as described further herein.

In one embodiment, the one or more computer systems are configured for locating and isolating portions of the images corresponding to the one or more 3D structures, and the images input to the DL model include only the isolated portions of the images corresponding to the one or more 3D structures. For example, in each image of the specimen generated by the imaging subsystem, the computer system(s) may locate and cut out the 2D bump image patches. In one such example, given relatively large frame images at a single focus offset during runtime or at different z focus offsets during training, the computer system(s) may crop patches from the frames, one patch per bump.

This locating and isolating step may be optional, but can increase the accuracy of the bump height predictions. For example, the images generated by the imaging subsystems described herein for the specimens described herein will generally include multiple structures and the area surrounding the structures, which may or may not include other patterned structures, for a number of reasons related to things like imaging subsystem configuration, optimal operating parameters like speed vs. magnification, etc. In other words, the imaging subsystems described herein are generally not configured to generate images for only a single structure on a specimen such as those described herein. Instead, they are advantageously designed to generate images for a relatively large area on a specimen in a relatively short amount of time. Even if the DL models described herein can be trained to predict a bump height of a bump using a bump image that includes images of other structures on the specimen, image data, signals, or noise from the area surrounding the bump, etc., the accuracy of the predictions will generally be higher if the input images include only images of bumps. Therefore, while the locating and isolating step is optional and may in some ways be considered trivial, it can provide advantages to the embodiments described herein. In addition, as described further herein, the locating and isolating step may be performed in different ways and may not necessarily be trivial due to, for example, the complexity of the images generated by the imaging subsystems described herein.

In another embodiment, the one or more computer systems are configured for locating and isolating one or more portions of the images corresponding to the one or more 3D structures, respectively, and generating individual one or more cropped patch images for individual one or more 3D structures, respectively, based on the isolated one or more portions. For example, as described above, it can be advantageous to modify the specimen images generated by the imaging subsystem so that each image input to the DL model includes an image of only a single bump on the specimen. In this manner, the input images may be generated on a per bump basis. If the specimen images include images generated with more than one mode (e.g., both DF and BF images), the input images may be generated on a per bump and per mode basis. In this manner, for each bump on a specimen whose height is being predicted, an input image may be generated for each mode used to generate the specimen images and each input image generated for that bump may include only the cropped out bump image. The locating and isolating step may be performed as described herein. Generating the individual one or more cropped patch images may be performed as described further herein, e.g., using a mask.

Figure 5:
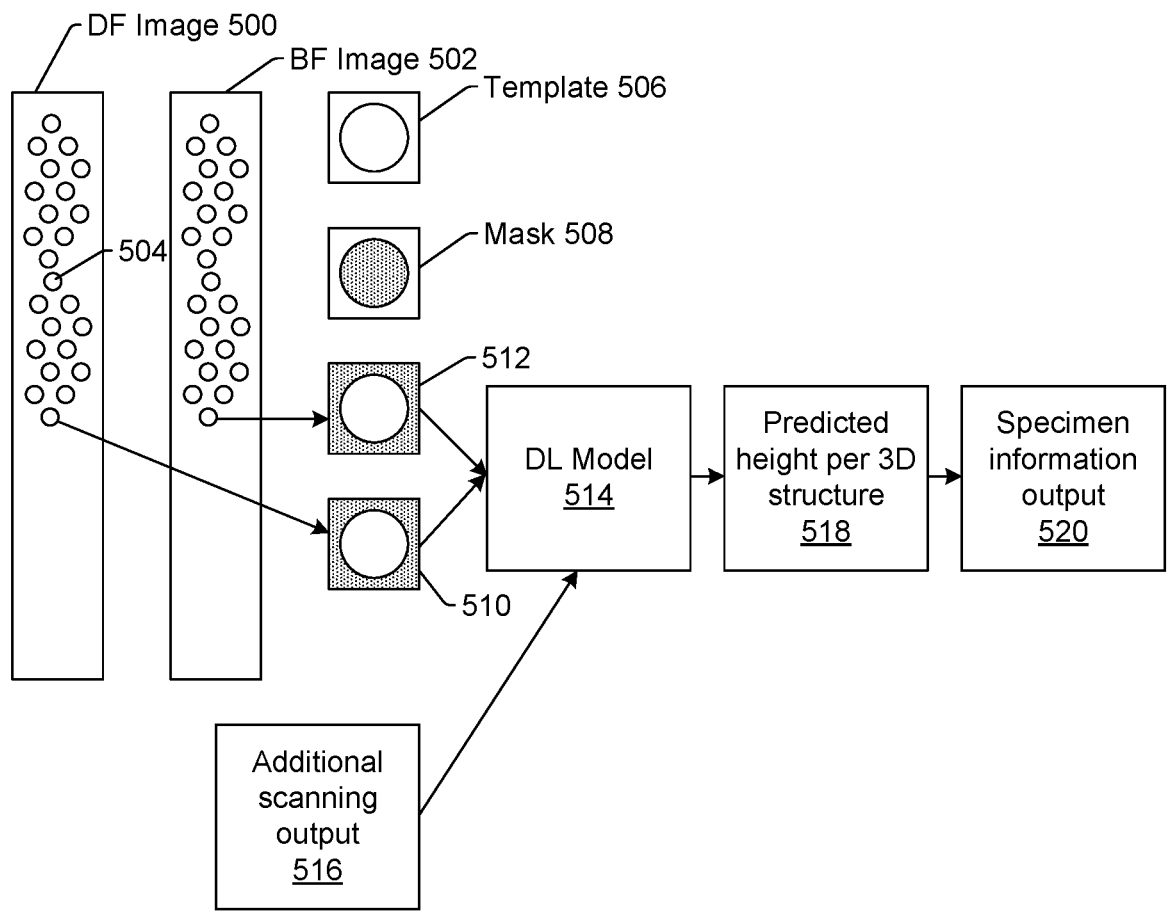
FIG. 5 is a flow chart illustrating one embodiment of a method for determining information for a specimen.

In a further embodiment, the one or more computer systems are configured for locating and isolating portions of the images corresponding to the one or more 3D structures by template matching. FIG. 5 shows one flow chart of steps that may be performed by the embodiments described herein that include identifying and isolating bumps in images using a template. In particular, the imaging subsystem (not shown in FIG. 5) may be configured for generating both DF image 500 and BF image 502 for a specimen (not shown in FIG. 5). The images shown in FIG. 5 correspond to the same area on the specimen and therefore both include bumps 504 in the same patterns within the images. The "images" shown in FIG. 5 are not meant to shown any actual images that may be generated by the imaging subsystems described herein. Specifically, BF and DF images will generally look very different from each other rather than appearing basically the same as shown in FIG. 5. In addition, not all of the bumps will appear as perfect circles having the same dimensions as in the images shown in FIG. 5. Instead, these "images" are only included in FIG. 5 to illustrate how the embodiments described herein may transform input images into predicted bump heights. As in other embodiments described herein, when the DL model is being used for runtime prediction of bump heights, images 500 and 502 advantageously need include only nominal focus images for bump height inspection and metrology, rather than images generated at multiple focus settings.

The individual bumps may be found in both of the images using template 506. In particular, template 506 may be compared to the images to try to find image portions that match the template. Therefore, when the template has characteristics that are determined based on the expected bump images, the template can be used to identify locations of bump images within the larger images 500 and 502. Once a portion of an image has been identified as containing a bump image, mask 508 may be applied to that portion of the image to eliminate as much non-bump related image data or signals in that image portion as possible thereby leaving only the bump related image data or signals. Therefore, by applying the template and mask, for any one bump image portion found in images 500 and 502, isolated bump patch images 510 and 512 may be generated, respectively. Each isolated bump patch image is therefore for a single bump and a single mode.

These images may then be input by the one or more computer systems into DL model 514 in any suitable manner known in the art. DL model 514 may include any of the AI DL models described herein such as a multi-layer CNN that generates a linear output per bump. In other words, the DL model may generate a regression output or a number for each bump. Output 518 of the DL model may include predicted height per 3D structure such as a list of bump heights. The one or more computer systems may then use the predicted height per 3D structure to generate specimen information output 520, which may include any of the specimen information described herein determined in any manner described herein.

In addition to the images input to the DL model by the one or more computer systems, the DL model may have one or more additional channels for input such as additional scanning output 516, which may be generated by the imaging subsystem during scanning of the specimen and/or by the computer system(s) based on the output of the imaging subsystem. Such additional scanning output may include, but is not limited to, tool telemetry auto focus data, stage position, temperatures, etc. The computer system(s) may input such data into the DL model in any suitable manner. The DL model may be trained to use this additional channel of information for bump height prediction in the same manner that other training described herein is performed.

In an additional embodiment, the one or more computer systems are configured for locating and isolating portions of the images corresponding to the one or more 3D structures based on design information for the specimen. For example, if the design information for the specimen is available for use by the embodiments described herein, it can be relatively straightforward to identify the locations of the 3D structures in the images generated of the specimen using some type of image-to-design alignment method or system. In general, most image-to-design alignment includes aligning a specimen image of a unique structure on the specimen to its corresponding design information and then using results of that aligning step to align additional specimen images to the design information, e.g., via coordinate transformation. Some examples of useful image-to-design alignment methods can be found in U.S. Pat. No. 7,676,077 to Kulkarni et al. issued Mar. 9, 2010, U.S. Pat. No. 8,041,103 to Kulkarni et al. issued Oct. 18, 2011, U.S. Pat. No. 9,830,421 to Bhattacharyya et al. issued Nov. 28, 2017, U.S. Pat. No. 10,127,653 to Duffy et al. issued Nov. 13, 2018, and U.S. Pat. No. 10,733,744 to Ha et al. issued Aug. 4, 2020, U.S. Patent Application Publication No. 2021/0097704 by Brauer et al. published Apr. 1, 2021, and commonly assigned U.S. patent application Ser. No. 17/308,878 by Brauer et al. filed May 5, 2021 and Ser. No. 17/334,179 by Brauer et al. filed May 28, 2021, all of which are incorporated by reference as if fully set forth herein. The embodiments described herein may be further configured as described in these references.

In another embodiment, the one or more computer systems are configured for locating and isolating portions of the images corresponding to the one or more 3D structures by inputting the images into a YOLO network configured for the locating and included in the one or more components executed by the one or more computer systems. In this embodiment, the YOLO DL network may be used in addition to the DL model described herein. The YOLO network may be trained to find the bumps in the first place and may perform much more reliably than the template matching approach described above.

In general, a YOLO network may include a single CNN that divides a larger image into smaller regions and predicts bounding boxes and (class) probabilities for each region. The bounding boxes may be weighted by the predicted possibilities. The YOLO network may be trained as described herein (e.g., with training images input to the YOLO network and with bounding boxes and their associated classes as the training output), and the YOLO network may have any suitable configuration known in the art. In such embodiments, then, the bumps may be found using the YOLO network, the one or more computer systems may crop out the bump top and use one of the DL models described herein such as an AlexNet to predict the bump top height.

The YOLO network is particularly interesting for the embodiments described herein because it can be trained to find most any "objects of interest" which can be measured. This ability may be particularly useful for the embodiments described herein because they may be used for measuring the height of 3D structures that have substantially different physical characteristics, like bumps versus deep vias, structures that have dramatically different shapes, structures that even if they have similar shapes may be formed of different materials that can cause substantial differences in their images, etc. The YOLO network has additional advantages including that it can simultaneously predict multiple bounding boxes in an image, which is useful since the images generated by the imaging subsystem typically contain images for multiple bumps, it is extremely fast compared to other object detection methods, and it can encode contextual information about the object images since it sees the entire image during training. Further details on YOLO networks can be found in "YOLO9000: Better, Faster, Stronger," by Redmon et al., arXiv:1613.08242, Dec. 25, 2016, 9 pages, which is incorporated by reference as if fully set forth herein. The embodiments described herein may be further configured as described in this reference.

Although a YOLO network may be particularly advantageous for the object detection described above, the embodiments described herein can be configured to use any other DL model known in the art suitable for object detection to find the bumps in the images. For example, a YOLO network is just one possible embodiment of an object finding DL network and any other suitable DL network may be used for object detection such as region based convolutional neural networks (R-CNN), which are functionally similar to YOLO networks. In this manner, in another embodiment, the one or more computer systems are configured for locating and isolating portions of the images corresponding to the one or more 3D structures by inputting the images into an additional DL model configured for the locating and included in the one or more components executed by the one or more computer systems. The additional DL model may be completely separate from the DL model that predicts the height information. The two DL models may also have different configurations such as different types of DL models and/or may be the same type of DL model but trained differently, i.e., one trained for object detection and one trained for height prediction. Each of such trainings may be performed as described herein.

The YOLO network or a functionally similar network may also be used in the embodiments described herein not just for object detection but also for height prediction. For example, in one embodiment, the DL model is configured as a YOLO network, and the YOLO network is configured for locating and isolating portions of the images corresponding to the one or more 3D structures. In this manner, the YOLO network may be used for both object detection and object height prediction. Having the YOLO network or another single DL model trained for both finding bumps and predicting the height of bumps or other 3D objects can provide advantages for the embodiments described herein since combining functions in a single network is often more computer efficient than having separate networks for different functions. However, the YOLO network may be configured for height prediction, and a different DL model may be configured as used for object detection. A YOLO network configured for both object detection and height prediction may be trained as described further herein.

The one or more computer systems are also configured for determining information for the specimen based on the predicted height of the one or more 3D structures. In general, the information that is determined by the computer system(s) based on the predicted height may be any inspection- and/or metrology-like information such as that described herein. In addition, the information that is determined for the specimen based on the predicted height of the one or more 3D structures may be a combination of multiple types of information described herein (e.g., both an identification of which 3D structure(s) are defective and a height metric like average height or a map of bump heights).

Figure 3:
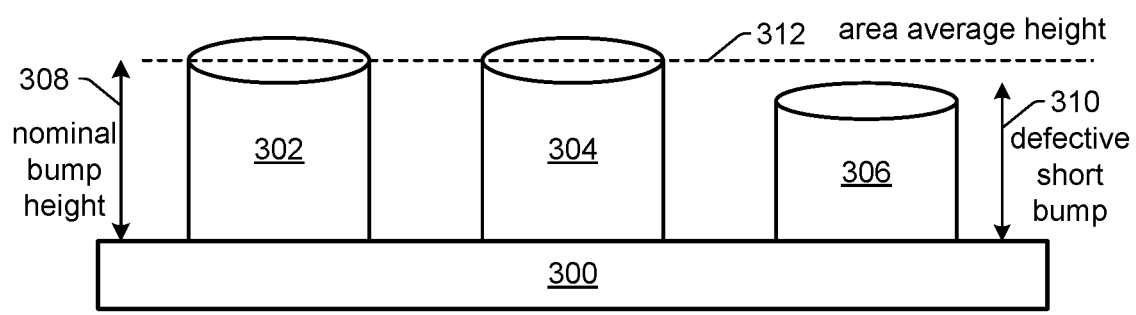
FIG. 3 is a schematic diagram illustrating a cross-sectional view of examples of bumps having various heights and information that can be determined for the bumps by the embodiments described herein.

In one embodiment, determining the information includes determining if any of the one or more 3D structures are defective. In this manner, the computer system(s) may find defective bumps including those which are short. In one such embodiment for inspection, the one or more computer systems may flag bump height errors above a threshold. In one illustrative example, FIG. 3 shows pillar type bump examples 302, 304, and 306 formed on specimen 300. The images generated for the specimen by the imaging subsystem may be input to the DL model (possibly with the pre-processing described herein), and the DL model outputs predicted heights for each of the bumps. Those predicted heights may be compared to nominal bump height 308, which may be the designed or desired bump height. If any of the predicted heights are below that nominal bump height, the one or more computer systems may designate the bumps having such predicted heights as defective or defect candidates. For example, as shown in FIG. 3, bumps 302 and 304 have nominal bump height 308 while bump 306 has defective short bump height 310 and may therefore be designated as a defective short bump by the computer system(s).

As with any defect detection algorithm or method, the computer system(s) may compare the predicted height for each bump to a threshold (or thresholds) which may correspond to a range of bumps heights below (and possibly above) the nominal or designed bump height that are unacceptable for the bumps. If a bump has a predicted height that is lower or higher than acceptable, it can be detected by the computer system(s) via such comparisons. Other algorithms and methods may also be used for determining which of the bumps are defective (such as comparing a difference between the nominal bump height and the predicted bump height to a threshold that corresponds to acceptable variation in the bump height, finding bumps that have outlying predicted heights compared to other bumps on the specimen, etc.).

In another embodiment, the information includes an average height metric for the one or more 3D structures. In this manner, the computer system(s) may produce a substantially accurate bump height metric such as average bump height over areas of the wafer. In one such embodiment for metrology, the one or more computer systems may average several bump heights in an area for an accurate measurement. In one such example shown in FIG. 3, the computer system(s) may use the predicted heights for bumps 302, 304, and 306 to determine an area average height shown by horizontal dashed line 312.

The number of predicted bump heights that are used to determine such an average height metric may obviously vary from that shown in FIG. 3 and may include many more than 3 bumps. The average height metric may be a local height metric, which is determined from fewer than all of the bumps on the specimen and only the bumps in a localized area on the specimen, or a global height metric, which is determined from all (or at least a majority) of the bumps on the specimen or fewer than all of the bumps on the specimen but spread across an entire area on the specimen. Multiple such metrics may also be determined for a die or a specimen.

The one or more computer systems may be configured for generating results for the specimen, which may include any of the information described herein such as information about any of the 3D structures determined to be defective, any of the height metric information, a map of bump heights across the specimen, predicted heights for individual 3D structures, etc. The results for the defective 3D structures may include, but are not limited to, locations of the defective 3D structures, detection scores, information about the defective 3D structure classifications such as class labels or IDs, etc., or any such suitable information known in the art. The results for the specimen may be generated by the computer system(s) in any suitable manner.

All of the embodiments described herein may be configured for storing results of one or more steps of the embodiments in a computer-readable storage medium. The results may include any of the results described herein and may be stored in any manner known in the art. The results for the specimen may have any suitable form or format such as a standard file type. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. to perform one or more functions for the specimen or another specimen of the same type.

Such functions include, but are not limited to, altering a process such as a fabrication process or step that was or will be performed on the specimen in a feedback or feedforward manner, etc. For example, the computer system(s) may be configured to determine one or more changes to a process that was performed on the specimen and/or a process that will be performed on the specimen based on the defective 3D structures. The changes to the process may include any suitable changes to one or more parameters of the process. The computer system(s) preferably determine those changes such that the defective 3D structures can be reduced or prevented on other specimens on which the revised process is performed, the defective 3D structures can be corrected or eliminated on the specimen in another process performed on the specimen, the defective 3D structures can be compensated for in another process performed on the specimen, etc. The computer system(s) may determine such changes in any suitable manner known in the art.

Those changes can then be sent to a semiconductor fabrication system (not shown) or a storage medium (not shown) accessible to both the computer system(s) and the semiconductor fabrication system. The semiconductor fabrication system may or may not be part of the system embodiments described herein. For example, the imaging subsystem and/or the computer system(s) described herein may be coupled to the semiconductor fabrication system, e.g., via one or more common elements such as a housing, a power supply, a specimen handling device or mechanism, etc. The semiconductor fabrication system may include any semiconductor fabrication system known in the art such as a lithography tool, an etch tool, a chemical-mechanical polishing (CMP) tool, a deposition tool, and the like.

Each of the embodiments of each of the systems described above may be combined together into one single embodiment.

Another embodiment relates to a computer-implemented method for determining information for a specimen. The method includes generating images of a specimen with an imaging subsystem. One or more 3D structures are formed on the specimen. The method also includes predicting a height of the one or more 3D structures based on one or more of the images by inputting the one or more of the images into a DL model included in one or more components executed by one or more computer systems. In addition, the method includes determining information for the specimen based on the predicted height of the one or more 3D structures. The determining is performed by the one or more computer systems.

Each of the steps of the method may be performed as described further herein. The method may also include any other step(s) that can be performed by the system, computer system(s), and/or imaging subsystems described herein. The one or more computer systems, the one or more components, the DL model, and the imaging subsystem may be configured according to any of the embodiments described herein, e.g., computer system(s) 102, component(s) 100, DL model 104, and imaging subsystem 10, respectively. In addition, the method described above may be performed by any of the system embodiments described herein.

Figure 6:
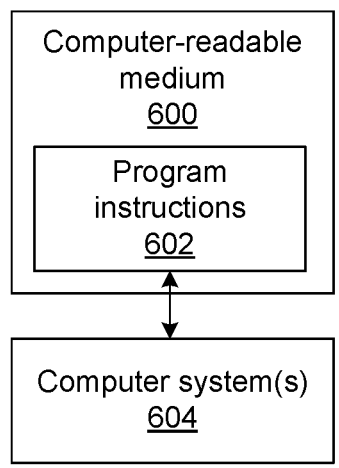
FIG. 6 is a block diagram illustrating one embodiment of a non-transitory computer-readable medium storing program instructions for causing one or more computer systems to perform a computer-implemented method described herein.

An additional embodiment relates to a non-transitory computer-readable medium storing program instructions executable on one or more computer systems for performing a computer-implemented method for determining information for a specimen. One such embodiment is shown in FIG. 6. In particular, as shown in FIG. 6, non-transitory computer-readable medium 600 includes program instructions 602 executable on computer system(s) 604. The computer-implemented method may include any step(s) of any method(s) described herein.

Program instructions 602 implementing methods such as those described herein may be stored on computer-readable medium 600. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system(s) 604 may be configured according to any of the embodiments described herein.

Further modifications and alternative embodiments of various aspects of the invention will be apparent to those skilled in the art in view of this description. For example, methods and systems for determining information for a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to determine information for a specimen, comprising:
   an imaging subsystem configured to generate images of a specimen, wherein one or more three-dimensional structures are formed on the specimen;
   one or more computer systems; and
   one or more components executed by the one or more computer systems, wherein the one or more components comprise a deep learning model configured for predicting a height of the one or more three-dimensional structures based on one or more of the images; and
   wherein the one or more computer systems are configured for:
      locating and isolating portions of the images corresponding to the one or more three-dimensional structures, wherein the images input to the deep learning model comprise only the isolated portions of the images corresponding to the one or more three-dimensional structures; and
      determining information for the specimen based on the predicted height of the one or more three-dimensional structures.

2. The system of claim 1, wherein the one or more three-dimensional structures are one or more bumps formed on a wafer.

3. The system of claim 1, wherein determining the information comprises determining if any of the one or more three-dimensional structures are defective.

4. The system of claim 1, wherein the information comprises an average height metric for the one or more three-dimensional structures.

5. The system of claim 1, wherein the images input to the deep learning model are collected by the imaging subsystem in a single pass of the specimen.

6. The system of claim 1, wherein the images input to the deep learning model are collected by the imaging subsystem at a single focus value.

7. The system of claim 1, wherein the images comprise bright field images of the specimen or dark field images of the specimen.

8. The system of claim 1, wherein the images comprise bright field images of the specimen and dark field images of the specimen.

9. The system of claim 1, wherein the one or more computer systems are further configured for training the deep learning model with the images generated by the imaging subsystem of the specimen or a different specimen with two or more focus offsets.

10. The system of claim 1, wherein the one or more computer systems are further configured for training the deep learning model with images generated by the imaging subsystem of a different specimen having the three-dimensional structures formed thereon with multiple, known values of a characteristic of the three-dimensional structures.

11. The system of claim 1, wherein the one or more computer systems are further configured for locating and isolating one or more of the portions of the images corresponding to the one or more three-dimensional structures, respectively, and generating individual one or more cropped patch images for individual one or more three-dimensional structures, respectively, based on the isolated one or more portions.

12. The system of claim 1, wherein the one or more computer systems are further configured for said locating and isolating the portions of the images corresponding to the one or more three-dimensional structures by template matching.

13. The system of claim 1, wherein the one or more computer systems are further configured for said locating and isolating the portions of the images corresponding to the one or more three-dimensional structures based on design information for the specimen.

14. The system of claim 1, wherein the one or more computer systems are further configured for said locating and isolating the portions of the images corresponding to the one or more three-dimensional structures by inputting the images into a YOLO network configured for the locating and included in the one or more components executed by the one or more computer systems.

15. The system of claim 1, wherein the one or more computer systems are further configured for said locating and isolating the portions of the images corresponding to the one or more three-dimensional structures by inputting the images into an additional deep learning model configured for the locating and included in the one or more components executed by the one or more computer systems.

16. The system of claim 1, wherein the deep learning model is further configured as a convolutional neural network.

17. The system of claim 1, wherein the deep learning model comprises a combination of convolution layers and fully connected layers.

18. The system of claim 1, wherein the deep learning model is further configured as an AlexNet.

19. The system of claim 1, wherein the deep leaning model is further configured as a YOLO network, and wherein the YOLO network is further configured for said locating and isolating the portions of the images corresponding to the one or more three-dimensional structures.

20. The system of claim 1, wherein the imaging subsystem is further configured as an inspection subsystem.

21. The system of claim 1, wherein the imaging subsystem is further configured as a metrology subsystem.

22. The system of claim 1, wherein the imaging subsystem is further configured as a light based subsystem.

23. The system of claim 1, wherein the imaging subsystem is further configured as an electron beam subsystem.

24. The system of claim 1, wherein the specimen is a wafer.

25. A non-transitory computer-readable medium, storing program instructions executable on one or more computer systems for performing a computer-implemented method for determining information for a specimen, wherein the computer-implemented method comprises:
- generating images of a specimen with an imaging subsystem, wherein one or more three-dimensional structures are formed on the specimen;
- locating and isolating portions of the images corresponding to the one or more three-dimensional structures;
- predicting a height of the one or more three-dimensional structures based on one or more of the images by inputting the one or more of the images into a deep learning model included in one or more components executed by the one or more computer systems, wherein the images input to the deep learning model comprise only the isolated portions of the images corresponding to the one or more three-dimensional structures; and
- determining information for the specimen based on the predicted height of the one or more three-dimensional structures.

26. A computer-implemented method for determining information for a specimen, comprising:
- generating images of a specimen with an imaging subsystem, wherein one or more three-dimensional structures are formed on the specimen;
- locating and isolating portions of the images corresponding to the one or more three-dimensional structures;
- predicting a height of the one or more three-dimensional structures based on one or more of the images by inputting the one or more of the images into a deep learning model included in one or more components executed by one or more computer systems, wherein the images input to the deep learning model comprise only the isolated portions of the images corresponding to the one or more three-dimensional structures; and
- determining information for the specimen based on the predicted height of the one or more three-dimensional structures, wherein the locating and isolating and the determining are performed by the one or more computer systems.

* * * * *